United States Patent [19]

White et al.

[11] 4,069,429
[45] Jan. 17, 1978

[54] IGFET CLOCK GENERATOR

[75] Inventors: William H. White, Indialantic; Mario A. Lorie, Palm Bay, both of Fla.

[73] Assignee: Harris Corporation, Cleveland, Ohio

[21] Appl. No.: 722,444

[22] Filed: Sept. 13, 1976

[51] Int. Cl.$^2$ .................. H03K 5/159; H03K 5/04; H03K 19/08; H03K 19/34
[52] U.S. Cl. .................................. 307/265; 307/205; 307/208; 307/214; 307/215
[58] Field of Search ............... 307/205, 208, 214, 215, 307/246, 251, 265-268, 293

[56] References Cited

U.S. PATENT DOCUMENTS

| | | | |
|---|---|---|---|
| 3,588,543 | 6/1971 | Schwartz | 307/265 |
| 3,628,065 | 12/1971 | Hill | 307/293 X |
| 3,755,691 | 8/1973 | Cassarino | 307/208 |
| 3,851,189 | 11/1974 | Moyer | 307/238 X |
| 3,862,440 | 1/1975 | Suzuki et al. | 307/266 |

Primary Examiner—Larry N. Anagnos
Attorney, Agent, or Firm—Leitner, Palan & Martin

[57] ABSTRACT

A circuit having an input terminal connected to one input of a NOR gate through three cascaded IGFET inverters and connected directly to the other input of the NOR gate for producing an output pulse in response to an input signal going from a first voltage level to a second voltage level. The output pulse has a width which is a function of the time delay imparted by the high resistance device of two unbalanced IGFET inverters and the parasitic capacitors at the output of each of the unbalanced inverters.

17 Claims, 6 Drawing Figures

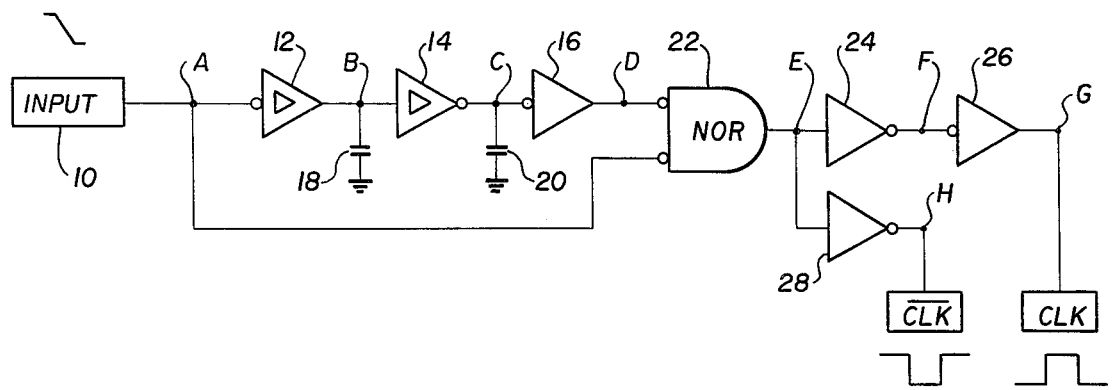
FIG.1
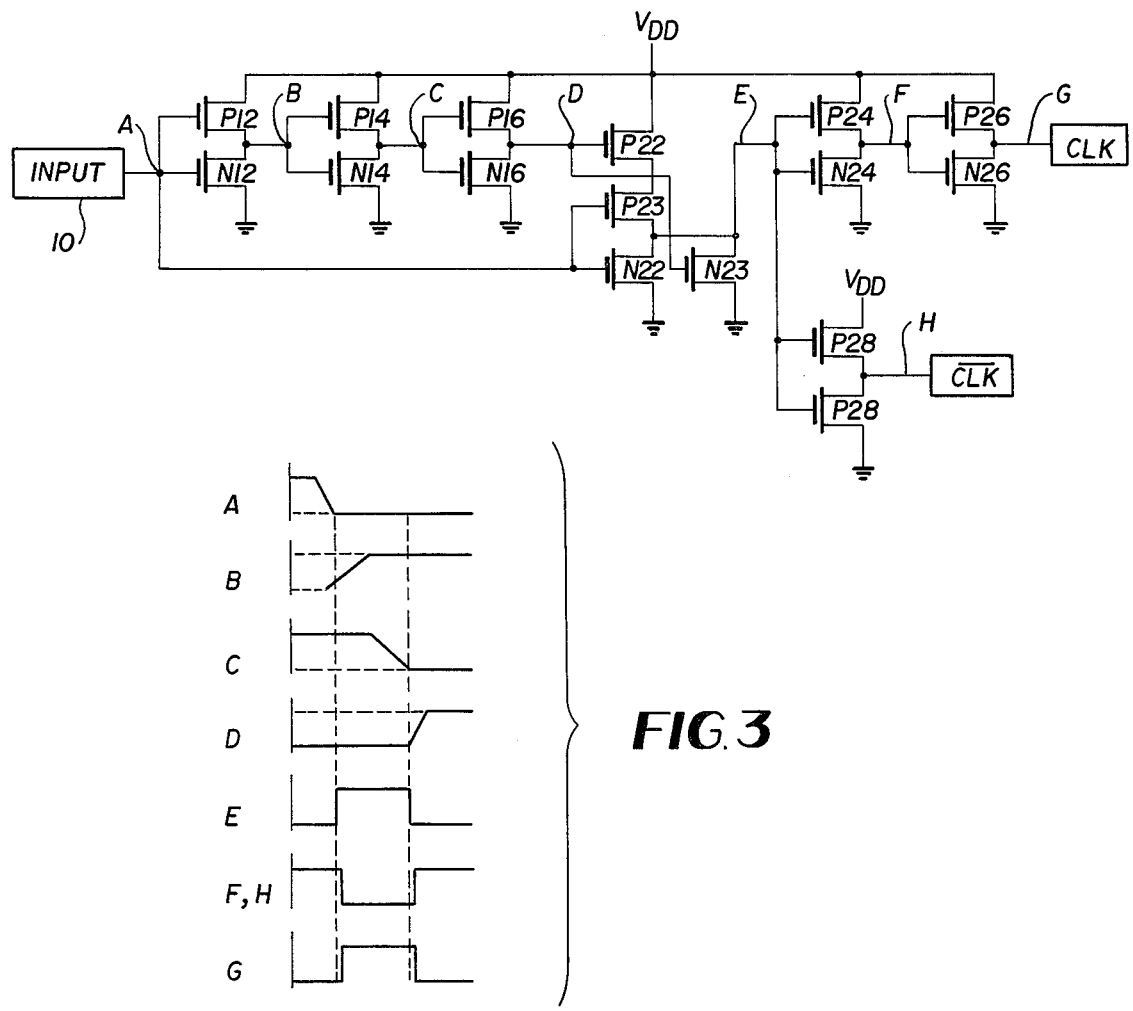
FIG.2
FIG.3

IGFET CLOCK GENERATOR

BACKGROUND OF THE INVENTION

1. Field of the Invention

The present invention relates generally to clock generators and more specifically to a clock generator using complementary insulated gate field effect transistor inverters for producing a time delay.

2. Description of the Prior Art

In the field of clock generators or pulse-producing circuits, it is common to use time delay circuits and inverters in one or both parallel paths between the input and output logic. The composite circuit produces a pulse of a duration as a function of the time delays. In the prior art, the time delays are generally produced by resistor-capacitor circuits or by clocked inverters. The resistor-capacitor circuits increase the size and layout complexity and process steps of integrated circuits. The time delay of the clocked inverter is produced by the timing of the clock pulses. Though clock converters do produce an output pulse of a given width in response to a given input signal, it is not truly a clock circuit since it requires an external timing signal in addition to an input signal.

There exists a need for a clock producing or clock generator circuit wherein the circuit is self-contained and produces an output pulse in response to an input signal. With the advance of integrated circuits, it has also become important that the circuit take advantage of inherent design characteristics of the elements in the integrated circuit to reduce the number of additional circuit elements. It is known that complementary insulated gate field effect transistors (IGFET) inverters operate in a wide range of operating voltages and minimizes participation. Also, the use of parasitic capacitors to produce a time delay between stages of complementary IGFETs has been used in other circuit applications. The use of unbalanced or different resistivity devices in a complementary pair of IGFETs has also been used in other logic circuits.

SUMMARY OF THE INVENTION

The present invention is a pulse producing circuit which takes advantage of parasitic capacitors and different resistivity of unbalanced, complementary insulated gate field effect transistor inverters to produce a time delay for providing an output pulse in response to an input signal whose width is a function of the time delay. Three complementary IGFET inverters are connected in cascade between an input terminal and one input of a NOR gate forming part of an output circuit. At least two of the inverters are unbalanced and include parasitic capacitors in their output so as to react slower to a change of input signal from a first voltage level to a second voltage level. The other input of a NOR gate is connected directly to the input terminal. The output pulse is responsive to the change from the first voltage level to the second voltage level to produce a pulse whose width is a function of the unbalanced resistivity and the parasitic capacitors of the inverter stages. The output circuit includes, in addition to the NOR gate, a pair of inverters connected to the output of the NOR gate to produce the clock pulse and a single inverter connected to the output of the NOR gate to produce the complementary of the clock pulse. The circuit is designed to be responsive to negative going input signals to produce the output clock pulse.

OBJECTS OF THE INVENTION

An object of the present invention is to provide an integrated clock generator taking advantage of inherent parasitic capacitors and the unbalanced resistivity of complementary insulated gate field effect transistors.

Another object is to provide a pulse generator which requires no external clocking pulse or pulses.

A further object of the invention is to provide a pulse producing circuit which operates over a wide voltage range and minimizes power dissipation.

Still another object is to provide clock and clock pulses which are well-balanced with skews of only few nanoseconds.

Other objects, advantages, and novel features of the present invention will become apparent from the following detailed description when considered in conjunction with the accompanying drawings.

BRIEF DESCRIPTION OF THE DRAWINGS

FIG. 1 is a diagramatic representation of a circuit embodying the principals of the present invention.

FIG. 2 is a circuit schematic diagram of the circuit of FIG. 1.

FIG. 3 illustrates the signal waveform at various indicated portions of the circuit shown in FIGS. 1 and 2.

DESCRIPTION OF THE PREFERRED EMBODIMENTS

Figure 4:
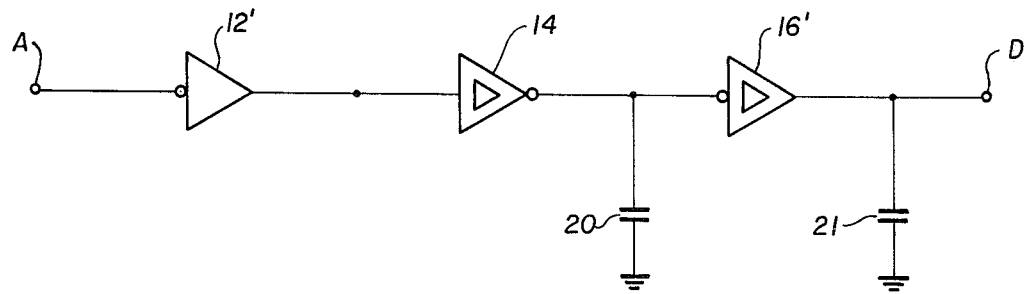
FIGS. 4, 5, and 6 are modifications of the cascade arrangement of the inverters of FIG. 1.

FIG. 1, which illustrates a preferred embodiment of the clock generator of the present invention, shows an input terminal 10 connected to a NOR gate 22 directly and through three cascaded inverters 12, 14, and 16 separted by capacitors 18 and 20. Two of the inverters—for example, 12 and 14—are unbalanced complementary insulated gate field effect transistor (IGFET) inverters and are illustrated by the double concentric triangles and the capacitors 18 and 20 are parasitic capacitors inherent to the structure of IGFET inverters 12 and 14. The circle at the input of inverters 12 and 16 is used to denote that these inverters are sensitive to negative edges.

The unbalanced inverters 12 and 14 are inverters having a different response to two different voltage levels. By making one member of the complementary pair of IGFETs forming the inverter of a greater resistivity than the other member of the pair, the inverter will respond quicker to an input going from one voltage level to a second voltage level than to an input signal going from the second voltage level to the first voltage level. The parasitic capacitors aid in producing the delay between stages.

The output circuit includes NOR gate 22 and inverters 24, 26, and 28 to produce CLK and $\overline{\text{CLK}}$ output signals. The output of NOR gate 22 is connected to inverters 24 and 26 to produce the output signal CLK which is a positive going pulse and to inverter 28 to produce the output signal $\overline{\text{CLK}}$ which is a negative going pulse.

FIG. 2 schematically illustrates the circuitry of FIG. 1 wherein inverters 12, 14, and 16 are made up of IGFETs P12 and N12; IGFETs P14 and N14 and IGFETs P16 and N16, respectively. Nor gate 22 is comprised of IGFETs P22, N22, P23 and N23. The output inverters 24, 26 and 30 are made up of IGFETs P24 and N24, P26 and N26, and P28 and N28 respectively.

The present circuit is designed to be responsive to or triggered by a negative going signal. With this criteria in mind, unbalanced inverter 12 is designed such that the channel resistivity of P12 is greater than the channel resistivity of N12 and unbalanced inverter 14 is designed such that the channel resistivity of N14 is greater than the channel resistivity of P14. This causes inverter 12 to have a greater resistivity of negative going signals and inverter 14 to have a greater resistivity to positive going signals at their inputs. In other words, inverters 12 and 14 have high resistivities to negative going signals at the input terminal 10. The width and length of the channel regions for all of the IGFETs in FIG. 2 are illustrated in Table I.

TABLE I

| IGFET | CHANNEL LENGTH (mils) | CHANNEL WIDTH (mils) |
|---|---|---|
| P12 | 1.7 | 0.3 |
| N12 | 0.3 | 1.0 |
| P14 | 0.3 | 1.0 |
| N14 | 3.4 | 0.3 |
| P16 | 0.3 | 2.0 |
| N16 | 0.3 | 1.3 |
| P22 | 0.3 | 6.0 |
| N22 | 0.3 | 1.3 |
| P23 | 0.3 | 6.0 |
| N23 | 0.3 | 1.3 |
| P24 | 0.3 | 10.0 |
| N24 | 0.3 | 8.1 |
| P26 | 0.3 | 10.0 |
| N26 | 0.3 | 8.1 |
| P28 | 0.3 | 10.0 |
| N28 | 0.3 | 8.1 |

The operation of the circuit of FIGS. 1 and 2 will be explained with reference to waveforms of FIG. 3 whose letters designate specific points in the circuit of FIGS. 1 and 2. When the input signal 10 is a negative going signal at point A, IGFET P12 of inverter 12 conducts to produce the signal illustrated at point B. The waveform illustrated in FIG. 3 at point B shows a slow rise in response to the negative going signal A. This is because the resistivity of P12 is relatively larger and its combination with parasitic capacitor 18 produces a time delay between the input and output of inverter 12. When the signal at point B reaches its upper voltage level, IGFET N14 of inverter 14 conducts to produce the signal at point C which falls at a relatively slow rate. This results from the relatively high resistivity of N14 and its combination with parasitic capacitor 20 to produce a time delay between the input and output of inverter 14. Once the signal at point C reaches the lower voltage level, IGFET P16 of inverter 16 conducts to produce substantially instantaneously the signal at D.

The time delay between the negative going portion of signal A and the positive going portion of signal D is produced by the relative high resistivity of IGFETs P12 and N14 and the parasitic capacitors 18 and 20. As will be explained, the output signals CLK and $\overline{CLK}$ (signals G and H in FIG. 3) are pulses having a width defined by this time delay. It should be noted that IGFETs N12, P14, and N16 of inverters 12, 14 and 16 will respond substantially instantaneously as IGFET P16 of inverter 16 since their resistivity is relatively low. The rise and fall time of IGFETs P12 and N14 are a function of the channel width and length and though the time is illustrated as substantially equal, the IGFETs may be designed to produce any overall time delay.

NOR gate 22 is responsive to the signal D and the signal A and has an output illustrated as signal E. NOR gate 22 has a high output when both of its inputs are a low voltage level. This condition occurs once the input signal A has changed from a high voltage level to a low voltage level and continues until signal D changes from a low voltage level to a high voltage level. The time it takes input signal D to change from a low voltage level to a high voltage level is determined by the amount of time it takes inverters 12, 14, and 16 to transmit the signal A to the NOR gate 22 as signal D. The time delay is a function of the parasitic capacitor in combination with the resistance of IGFETs P12 and N14. The output signal E of NOR gate 22 is transmitted through inverter 24 to provide signal F, which is then transmitted through inverter 26 to form signal G or the output pulse CLK. The inverse, or pulse $\overline{CLK}$, is the signal E transmitted through inverter 30 to produce signal H.

Figure 5:
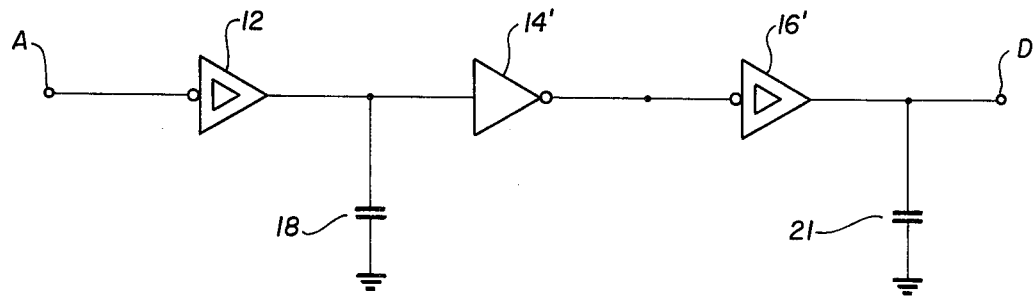
Figure 6:
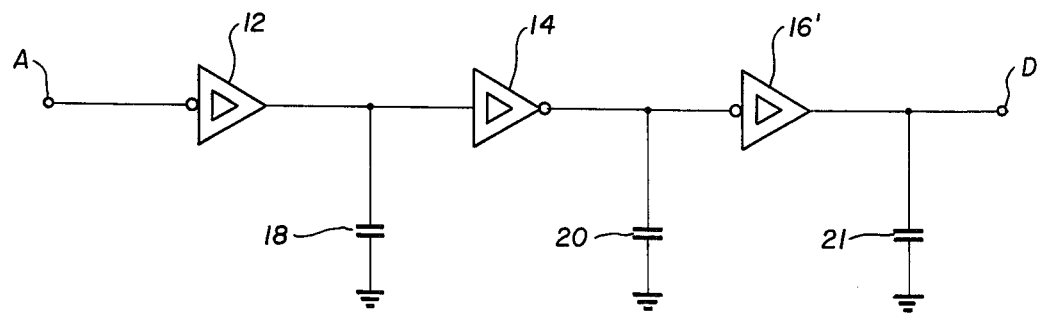

Variations on the arrangement of the three cascaded inverters are illustrated in FIGS. 4, 5, and 6. A balanced inverter 12', an unbalanced inverter 14 and parasitic capacitor 20, and unbalanced inverter 16' and parasitic capacitor 21 are shown cascaded between points A and D in FIG. 4. An unbalanced inverter 12 and parasitic capacitor 18, a balanced inverter 14' and an unbalanced inverter 16' and parasitic capacitor 21 are shown in FIG. 5 cascaded between points A and D. Three unbalanced inverters 12, 14, and 16' and three parasitic capacitors 18, 20, and 21 are shown in FIG. 6 cascaded between points A and D. The order of the unbalanced inverters is not critical nor where two or three of the inverters are unbalanced. The use of three unbalanced inverters in FIG. 6 allows a wider pulse width without substantially modifying the geometry of the IGFETs of the inverters. The unbalance of inverters 12 and 14 is the same as that described in FIGS. 1 and 2. Unbalanced inverter 16' would include a P channel device of greater resistivity and consequently react slower to a negative going signal.

From the description of the circuit of FIGS. 1 and 2 and the signals of FIG. 3, it is obvious that the present invention makes use of the parasitic capacitors and the unbalanced or uneven resistivity characteristics which may be built into a complementary insulated gate field effect transistor inverters to produce time delay for a pulse producing or clock generator circuit. The parasitic capacitors may be 1.5 picofarads but may vary depending on the thickness of the oxide below the metal layer. The time delay can also be varied by changing the width and length of the channel. Although the present invention has been illustrated and described in detail, it is to be clearly understood that the same is by way of illustration and example only and is not to be taken by way of limitation; the spirit and scope of this invention to be limited only by the terms of the appended claims.

What is claimed is:

1. A pulse producing circuit comprising:
   input means;
   output means having a first input connected to said input means and a second input;
   three inverter means connected in cascade between said input means and said second input of said output means, two of said inverter means being unbalanced in their response to voltage level changes at said input means each for producing a time delay;
   said output means produces a pulse for a specific direction of voltage level change at said input means for a duration determined by said time delays.

2. The pulse producing circuit of claim 1 wherein said inverter means are complementary pairs of insulated gate field effect transistors and said three inverter means included a parasitic capacitor between each inverter means.

3. The pulse producing circuit of claim 1 wherein said unbalanced inverter means respond slower to negative going signals at said input means than to positive going signals and said output means includes a NOR gate whereby said NOR gate produces a pulse for a negative going input signal.

4. The pulse producing circuit of claim 3 wherein said two unbalanced inverter means are the first two inverter means in the series and are complementary pairs of insulated gate field effect transistors, the P channel device of said first inverter means having a greater channel resistance than the N channel device and the N channel device of the second inverter means having a greater channel resistance than the P channel device.

5. The pulse producing circuit of claim 1 wherein said inverter means and said output means are continuously connected to a power source.

6. The pulse producing circuit of claim 1 wherein said output means includes a NOR gate whose inputs are said inputs of said output means, an inverter means connected to the output of said NOR gate for providing an output signal and a pair of inverter means connected in series with said output of said NOR gate for providing a pulse output.

7. The pulse producing circuit of claim 1 wherein said unbalanced inverter means each includes a capacitor at its output and they are first and second in said cascade connection.

8. The pulse producing circuit of claim 1 wherein said unbalanced inverter means each includes a capacitor at its output and they are first and third in said cascade connection.

9. The pulse producing circuit of claim 1 wherein said unbalanced inverter means each includes a capacitor at its output and they are second and third in said cascade connection.

10. A circuit comprising:

an input terminal;

three inverter means connected in cascade with said input terminal, two of said inverter means responding slower to a signal at said input terminal of a first voltage level than a second voltage level; and output means, having a first input from said input terminal and a second input from the output of the third inverter means, for producing an output pulse in response to an input signal at said input terminal of said first voltage level and whose duration is a function of a slower response of said two of said inverter means.

11. The circuit of claim 10 wherein each of said two of said inverter means are a pair of complementary insulated gate field effect transistors, one device of each pair having a greater channel resistance than the other device of the pair.

12. The circuit of claim 11 wherein said two of said inverter means are adjacent to each other in the cascade connection and the greater channel resistance device in one pair is of opposite conductivity type than the greater channel resistance device in the other pair.

13. The circuit of claim 10 wherein said inverter means are complementary pairs of insulated gate field effect transistors and said three inverter means include a parasitic capacitor between each inverter means.

14. The circuit of claim 10 wherein said inverter means and said output means are continuously connected to a power source.

15. The circuit of claim 10 wherein said output means includes a NOR gate whose inputs are said inputs of said output means, an inverter means connected to the output of said NOR gate for providing an output signal and a pair of inverter means connected in series with said output of said NOR gate for providing a pulse output.

16. The circuit of claim 10 wherein said two of said inverter means each include a capacitor at its output and they are first and third in said cascade connection.

17. The circuit of claim 10 wherein all of said inverter means are unbalanced and include parasitic capacitors in their output.

* * * * *